US008769471B2

(12) United States Patent
Noy

(10) Patent No.: US 8,769,471 B2
(45) Date of Patent: Jul. 1, 2014

(54) PRODUCING ELECTRICAL CIRCUIT PATTERNS USING MULTI-POPULATION TRANSFORMATION

(75) Inventor: Amir Noy, Kfar Mordehai (IL)

(73) Assignee: Orbotech Ltd., Yavne (IL)

( * ) Notice: Subject to any disclaimer, the term of this patent is extended or adjusted under 35 U.S.C. 154(b) by 569 days.

(21) Appl. No.: 13/061,344

(22) PCT Filed: Oct. 26, 2009

(86) PCT No.: PCT/IL2009/000998
§ 371 (c)(1),
(2), (4) Date: Feb. 28, 2011

(87) PCT Pub. No.: WO2010/049924
PCT Pub. Date: May 6, 2010

(65) Prior Publication Data
US 2011/0155424 A1     Jun. 30, 2011

(30) Foreign Application Priority Data
Oct. 28, 2008  (IL) .......................................... 194967

(51) Int. Cl.
*G06F 17/50*  (2006.01)
(52) U.S. Cl.
USPC ............................................ 716/137; 716/54
(58) Field of Classification Search
USPC ........................................................ 716/137
See application file for complete search history.

(56) References Cited

U.S. PATENT DOCUMENTS

| | | |
|---|---|---|
| 4,325,780 A | 4/1982 | Schulz, Sr. |
| 4,804,615 A | 2/1989 | Larson et al. |
| 4,835,704 A | 5/1989 | Eichelberger et al. |
| 5,129,009 A | 7/1992 | Lebeau |
| 5,162,240 A | 11/1992 | Saitou et al. |
| 5,649,022 A | 7/1997 | Maeda et al. |
| 5,980,088 A | 11/1999 | Iwasaki et al. |
| 6,023,842 A | 2/2000 | Larson |
| 6,080,656 A | 6/2000 | Shih et al. |
| 6,100,915 A | 8/2000 | Iwasaki et al. |
| 6,118,517 A | 9/2000 | Sasaki et al. |
| 6,165,658 A | 12/2000 | Taff et al. |

(Continued)

FOREIGN PATENT DOCUMENTS

| | | |
|---|---|---|
| JP | 3019395 A | 1/1991 |
| JP | 4260393 A | 9/1992 |

(Continued)

OTHER PUBLICATIONS

Michael Flat in "Printed Circuit Board Basics," third edition, Miller Freeman Books, ISBN 0-89730-486-3, 1997.

(Continued)

*Primary Examiner* — Jack Chiang
*Assistant Examiner* — Brandon Bowers
(74) *Attorney, Agent, or Firm* — Sughrue Mion, PLLC

(57) ABSTRACT

A method for producing an electrical circuit includes providing a substrate having a first pattern of features and defining a second pattern comprising a net of interconnected circuit elements. Different respective transformation rules are specified for different ones of the circuit elements. The second pattern is modified by applying the respective transformation rules to the circuit elements so as to align the circuit elements with the features in the first pattern, and the modified second pattern is applied to the substrate.

24 Claims, 3 Drawing Sheets

(56) References Cited

U.S. PATENT DOCUMENTS

| | | |
|---|---|---|
| 6,239,858 B1 | 5/2001 | Tomimatu |
| 6,245,657 B1 | 6/2001 | Chu et al. |
| 6,567,713 B2 | 5/2003 | Lichtenstein et al. |
| 6,581,202 B1 | 6/2003 | Tourne et al. |
| 6,701,197 B2 | 3/2004 | Ben-Ezra et al. |
| 6,709,962 B2 | 3/2004 | Berg |
| 6,770,866 B2 | 8/2004 | Retschke et al. |
| 6,879,789 B2 | 4/2005 | Yamada et al. |
| 6,905,950 B2 | 6/2005 | Subramanian et al. |
| 6,911,620 B2 | 6/2005 | Lipman et al. |
| 7,046,266 B1 | 5/2006 | Retschke et al. |
| 7,109,112 B2 | 9/2006 | Chopra et al. |
| 7,121,839 B2 | 10/2006 | Rathburn |
| 7,127,812 B2 | 10/2006 | Hiramatsu et al. |
| 7,283,660 B2 | 10/2007 | Ganot et al. |
| 7,372,616 B2 | 5/2008 | Bang et al. |
| 7,383,632 B2 | 6/2008 | Dittmann |
| 7,508,515 B2 | 3/2009 | Hanina et al. |
| 2001/0010536 A1 | 8/2001 | Katzir et al. |
| 2002/0112885 A1 | 8/2002 | Hotta et al. |
| 2002/0122109 A1 | 9/2002 | Ehsani et al. |
| 2003/0190071 A1 | 10/2003 | Ganot et al. |
| 2003/0208740 A1 | 11/2003 | Tourne et al. |
| 2004/0040148 A1 | 3/2004 | DeMaso et al. |
| 2004/0194303 A1 | 10/2004 | Kim et al. |
| 2005/0068054 A1 | 3/2005 | Mok et al. |
| 2005/0213806 A1 | 9/2005 | Hanina et al. |
| 2006/0088995 A1 | 4/2006 | Zhang et al. |
| 2007/0145568 A1 | 6/2007 | Ogawa |
| 2008/0113302 A1 | 5/2008 | Takashima et al. |
| 2008/0143379 A1 | 6/2008 | Norman |
| 2009/0145641 A1* | 6/2009 | Daniel et al. .................. 174/258 |
| 2010/0021045 A1 | 1/2010 | Cho et al. |

FOREIGN PATENT DOCUMENTS

| | | |
|---|---|---|
| JP | 4278515 | 10/1992 |
| JP | 5138420 A | 6/1993 |
| JP | 7231175 A | 8/1995 |
| JP | 9323180 A | 12/1997 |
| JP | 10048835 | 2/1998 |
| JP | 10150279 A | 4/1998 |
| JP | 2000099736 | 4/2000 |
| JP | 2002-341514 A | 11/2002 |
| JP | 2010-28067 A | 2/2010 |
| WO | WO 00/02424 A1 | 1/2000 |
| WO | WO 02/33492 A1 | 4/2002 |
| WO | WO 02/39794 A2 | 5/2002 |

OTHER PUBLICATIONS

C. A. Harper, "High Performance Printed Circuit Boards", ISBN: 0-07-026713-8, McGraw-Hill, 2000.

* cited by examiner

PRODUCING ELECTRICAL CIRCUIT PATTERNS USING MULTI-POPULATION TRANSFORMATION

FIELD OF THE INVENTION

The present invention relates generally to production of electric circuits, and specifically to alignment of features created in different stages of a circuit production process.

BACKGROUND OF THE INVENTION

Aligning circuit features that are created in different stages of the production process is a major challenge in the manufacturing of printed circuit boards. In a typical process, the circuit panel is first drilled to create through-holes; then layers of copper conductors, including pads and interconnections, are deposited on the panel; and finally a solder mask is overlaid on the conductors in preparation for assembling the circuit. (This sort of process is described, for example, by Michael Flat in "Printed Circuit Board Basics," third edition, Miller Freeman Books, ISBN 0-89730-486-3, 1997.) Incorrect alignment of any of these elements (holes, conductors or solder mask) may lead to faults in the circuit.

Various methods are known in the art for aligning circuit elements in the successive stages of production. For example, U.S. Patent Application Publication 2005/0213806, whose disclosure is incorporated herein by reference, describes a system and method for manufacturing printed circuit boards using non-uniformly modified images. An initial version of a computerized image of a pattern is supplied to a recording system, such as a laser direct imaging system, which modifies the initial version of the image non-uniformly prior to recording the modified version of the pattern on a substrate. The dimensions and/or shape of the pattern are modified so as to correspond to an electrical circuit pattern that was previously recorded on the substrate.

SUMMARY OF THE INVENTION

An embodiment of the present invention provides a method for producing an electrical circuit, including providing a substrate having a first pattern of features and defining a second pattern including a net of interconnected circuit elements. Different respective transformation rules are specified for different ones of the circuit elements. The second pattern is modified by applying the respective transformation rules to the circuit elements so as to align the circuit elements with the features in the first pattern, and the modified second pattern is applied to the substrate.

In some embodiments, the features in the first pattern include holes in the substrate, and the circuit elements in the second pattern include hole pads, and modifying the second pattern includes shifting the hole pads into alignment with the holes. In one embodiment, the circuit elements in the second pattern include contact pads, having respective predefined locations, and modifying the second pattern includes anchoring the contact pads in the respective predefined locations while the hole pads are shifted relative to the contact pads.

Typically, the circuit elements in the second pattern include connecting elements extending between the hole pads and the contact pads, and modifying the second pattern includes applying a geometrical transformation to the connecting elements responsively to a shift of the hole pads relative to the contact pads in order to maintain connectivity between the hole pads and the contact pads. Additionally or alternatively, the respective locations of the contact pads are defined by a solder mask, which is applied to the substrate after applying the modified second pattern.

In a disclosed embodiment, modifying the second pattern includes applying a geometrical transformation to connecting elements in the second pattern in order to maintain connectivity of the net in the modified second pattern. Typically, the geometrical transformation includes adjusting a length and an angular skew of one or more of the connecting elements. Additionally or alternatively, applying the geometrical transformation includes applying morphological dilation and erosion in order to modify the connecting elements.

In some embodiments, applying the modified second pattern includes producing conductors on the substrate by direct writing in accordance with the modified second pattern. Typically, modifying the second pattern includes generating a map for use by a direct patterning subsystem in writing the second pattern onto the substrate.

In a disclosed embodiment, the elements belong to different element types, and specifying the different respective transformation rules includes specifying type-specific transformation rules for the different types of elements.

There is also provided, in accordance with an embodiment of the present invention, apparatus for producing an electrical circuit, including a processor, which is coupled to receive data with respect to a first pattern of features on a substrate having, and to receive a definition of a second pattern including a net of interconnected circuit elements and a specification of different respective transformation rules for different ones of the circuit elements, and which is configured to modify the second pattern by applying the respective transformation rules to the circuit elements so as to align the circuit elements with the features in the first pattern. A patterning subsystem is configured to apply the modified second pattern to the substrate.

There is additionally provided, in accordance with an embodiment of the present invention, a computer software product, including a computer-readable medium in which program instructions are stored, which instructions, when read by a computer, cause the computer to receive data with respect to a first pattern of features on a substrate having, and to receive a definition of a second pattern including a net of interconnected circuit elements and a specification of different respective transformation rules for different ones of the circuit elements, and to modify the second pattern by applying the respective transformation rules to the circuit elements so as to align the circuit elements with the features in the first pattern in preparation for application of the modified second pattern to the substrate.

There is further provided, in accordance with an embodiment of the present invention, an electrical circuit, including a substrate and a set of features disposed on the substrate in a first pattern. A net of interconnected circuit elements is disposed on the substrate in respective locations in alignment with the features in the first pattern, wherein the respective locations of the circuit elements are determined by modifying a second pattern, which defines the net, in accordance with different respective transformation rules for different ones of the circuit elements so as to align the circuit elements with the features.

The present invention will be more fully understood from the following detailed description of the embodiments thereof, taken together with the drawings in which:

DETAILED DESCRIPTION OF EMBODIMENTS

Overview

Figure 1:
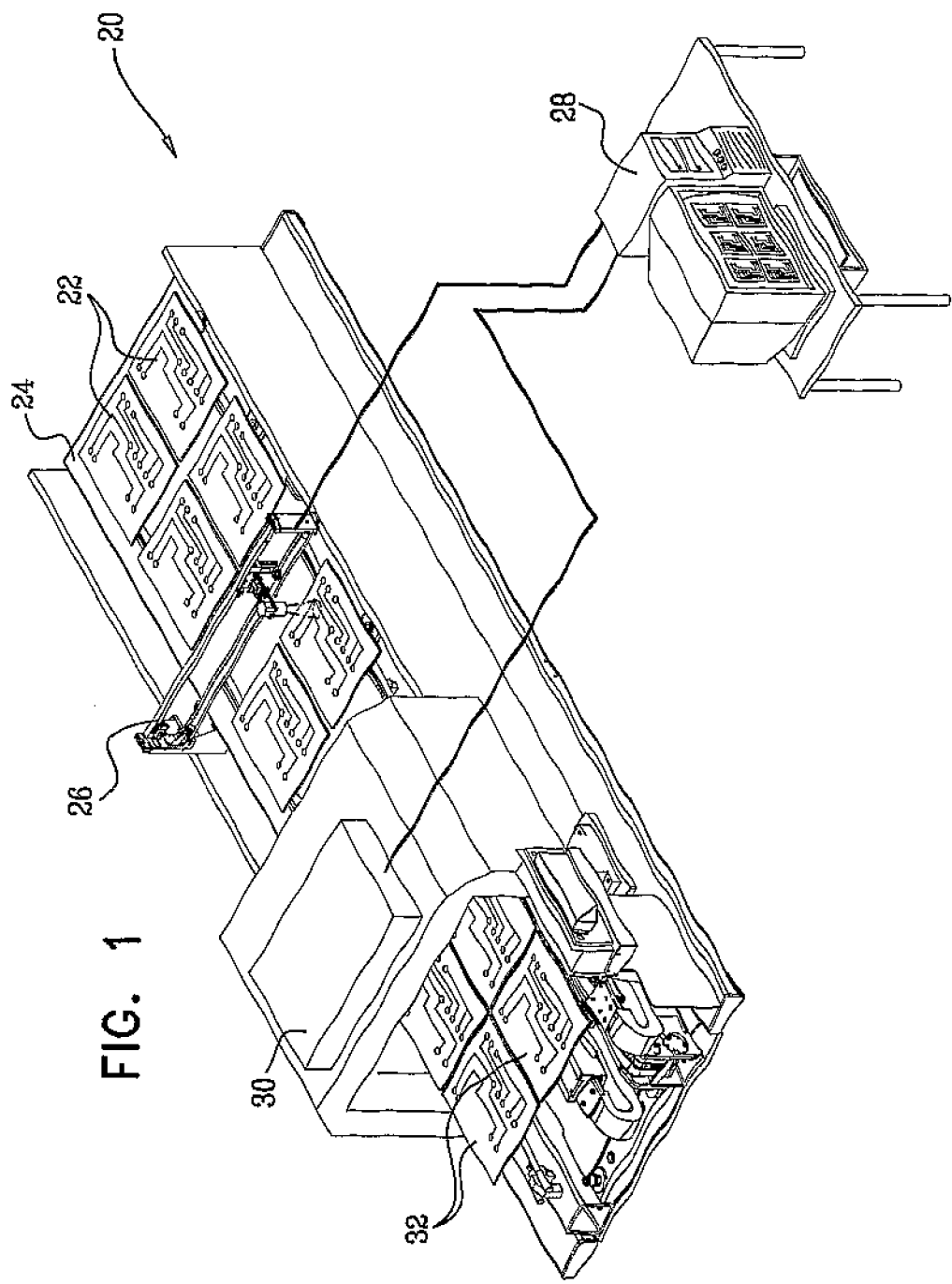
FIG. 1 is a schematic, pictorial illustration of a system for producing printed circuit panels, in accordance with an embodiment of the present invention.

Printed circuit panels typically comprise multiple layers of copper conductors. Each layer has its own pattern, comprising a "net" of interconnected circuit elements, which may be of multiple different types, including:

Hole pads, formed around and through respective holes in the substrate. The "holes" in this case may be drilled mechanically or by laser machining, for example.

Component pads, for connecting the net to the legs of electronic components that are subsequently assembled on the panel.

Connecting elements, comprising straight lines or other structures connecting between the pads.

The circuit elements in each layer must be aligned with the patterns of features made previously (such as holes) or to be made subsequently (such as a solder mask) on the substrate. For example, hole pads should conform to the locations of the holes. To compensate for misalignment, hole pads are typically made larger than the holes they are meant to surround, but the sizes of the holes and other elements are limited by the need to achieve high pattern density. In traditional printed circuit manufacturing, each pattern is copied onto the panel from a fixed mask, which generally limits the possibilities for correcting alignment errors.

More recently, direct patterning systems (also referred to as "direct imaging") have come into use, in which the pattern is written directly onto the substrate, typically by a laser beam. One system of this type is described, for example, in U.S. Pat. No. 7,046,266, whose disclosure is incorporated herein by reference. In this system, the laser beam writes the "negative" of the what would be considered a standard printed circuit mask, followed by chemical process that removes the unwritten parts (and thus creates the copper pattern). Another direct patterning technology uses inkjet printing techniques with a conducting polymer or other material to write the conducting material, solder mask, or other component onto the substrate. Direct patterning systems permit greater adjustment flexibility, although their full potential in this regard has not been realized in the prior art.

In the embodiments of the present invention that are described hereinbelow, a system for circuit production provides enhanced alignment of circuit layers by applying "multi-population transformations" to the elements of a pattern that is to be formed on the circuit substrate. The geometrical loci of the different elements in the pattern are defined as different "populations," and different, respective transformation rules are defined for different elements. The rules may be specific for each element type. For example, each hole pad may be transformed to align with the respective hole, while each component pad is "anchored" in its predefined location, i.e., constrained to align subsequently with the window in the solder mask belonging to the respective component. Connecting elements, however, may be allowed greater flexibility of transformation in order to maintain the required connectivity, so long as certain design rules are observed.

The system applies the appropriate transformation rules in transforming the locations and shapes of the elements in a given layer in order to align the elements with the corresponding features (such as holes and solder mask windows) of the other layers. The transformations are applied locally so as to adjust each population individually. As a result, hole pads and component pads can be precisely aligned in the required locations, even when different features in other layers impose conflicting requirements—such as hole pads that must move in one direction and component pads that must move in another to achieve optimal alignment.

This technique is particularly well suited for systems that use direct patterning, since the required corrections can be computed and implemented directly on each panel. On the other hand, the principles of the present invention may also be applied in creating modified masks, by means of a suitable plotter, for example, for copying the modified pattern to a panel or set of panels. All such types of equipment for producing patterns on circuit substrates are referred to generically as "patterning subsystems" in the context of the present patent application and in the claims.

Although certain embodiments are described herein with specific reference to production of copper pads and traces on a printed circuit board, the principles of the present invention may similarly be applied in the manufacture of other sorts of electrical products, such as flat panel displays.

System Description

FIG. 1 is a schematic, pictorial illustration of a system 20 for producing printed circuit panels 32, in accordance with an embodiment of the present invention. Panel substrates 22 are transported through the system by a conveyor 24. It is assumed at this stage that the substrates already have a certain pattern of features, such as holes produced (by mechanical or laser drilling, for example) in the substrates at predefined locations. System 20 is now to deposit a pattern comprising a net of copper elements in alignment with the holes. An optical sensing subsystem 26 captures images of the substrates as they move along the conveyor, and an image processor 28 analyzes the image data in order to detect the locations of the holes. Methods for performing this sort of image analysis are known in the art and are beyond the scope of the present invention.

Image processor 28 typically comprises a general-purpose computer, which is programmed in software to carry out the methods that are described herein. The software may be provided to the image processor in electronic form, over a network, for example, or it may alternatively or additionally be stored in tangible media, such as optical, magnetic or electronic storage media. Further alternatively or additionally, processor 28 may comprise dedicated or programmable signal processing and/or logic circuits.

A direct patterning subsystem 30 writes the pattern of copper elements onto each of substrates 22. This subsystem may be based, for example, on the DP-100™ or Paragon™-family of laser direct imaging systems, produced by Orbotech Ltd. (Yavne, Israel). Before the pattern is written onto the substrate, however, it is modified for proper alignment of the hole pads with the hole locations, as indicated by image processor 28. Typically, the hole pads are shifted without changing the locations in the pattern of the component pads, to ensure that the contact pads will be properly aligned with the solder mask that will be applied subsequently. In order to maintain connectivity while observing applicable design rules, the connecting elements between the pads are transformed using a multi-population transformation technique, as described further hereinbelow. Subsystem 30 then writes the modified pattern of copper elements onto substrates 22 in order to produce printed circuit panels 32.

Figure 2A:
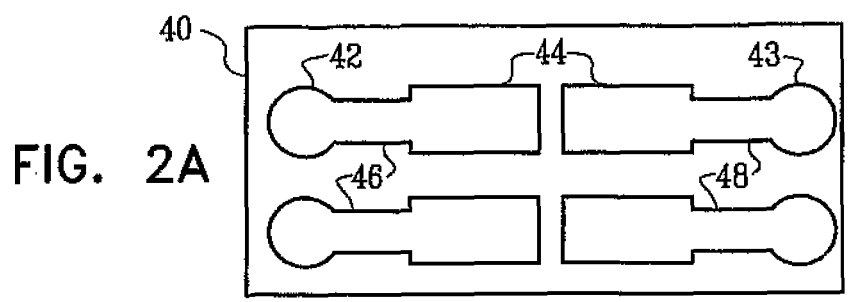
FIG. 2A is a schematic top view of a pattern of circuit elements that is to be applied to a printed circuit panel.
Figure 2B:
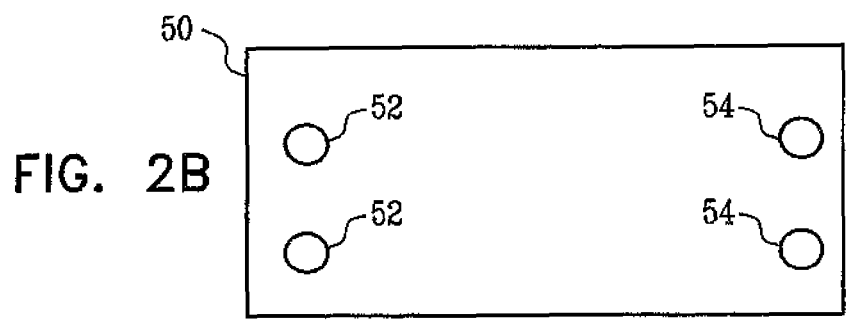
FIG. 2B is a schematic top view of a printed circuit substrate in which holes have been drilled.
Figure 3:
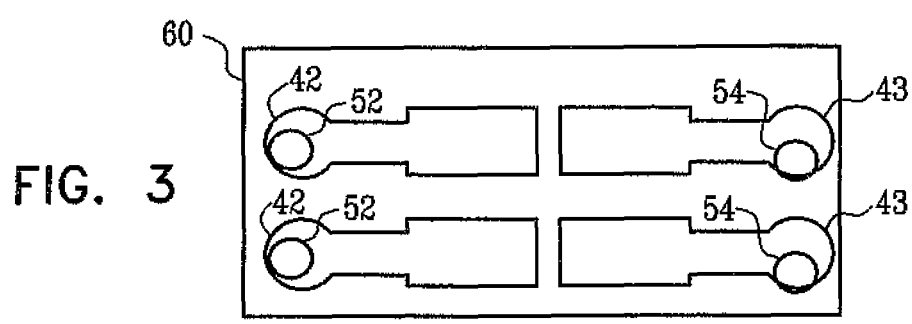
FIG. 3 is a schematic top view of a printed circuit panel that would result from overlaying the pattern of FIG. 2A on the holes of FIG. 2B.

Reference is now made to FIGS. 2A, 2B and 3, which schematically illustrate the problem that is addressed by the methods of multi-population transformation that are provided by embodiments of the present invention. FIG. 2A is a schematic top view of an original pattern 40 that is to be written by subsystem 30. The pattern comprises two types of hole pads 42 and 43, which are connected to contact pads 44 by two respective types of connecting elements 46 and 48. FIG. 2B is a schematic top view of a substrate 50 comprising two types of holes 52 and 54, with which pads 42 and 43 are supposed to be aligned.

As shown in FIG. 3, however, when original pattern 40 is printed to produce a panel 60, misalignment of pads 42 and 43 relative to respective holes 52 and 54 causes defective registration between the pads and the holes. Shifting the entire pattern 40 downward and to the left, relative to the pattern of holes 52 and 54 on substrate 50, will yield some improvement in the situation. The resulting registration of the pads with the holes will still be imperfect, however, and the shift of contact pads 44 may cause them to be misaligned with the respective windows in the solder mask that is overlaid on panel 60 in the next stage.

Figure 4:
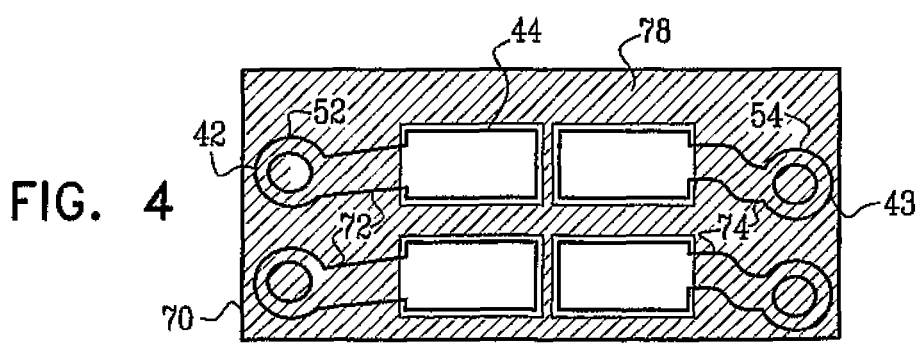
FIG. 4 is a schematic top view of a printed circuit panel on which a pattern has been printed following multi-population transformation of the pattern in accordance with an embodiment of the present invention.

FIG. 4 is a schematic top view of a panel 70 on which pattern 40 has been printed after first having been modified by multi-population transformation, in accordance with an embodiment of the present invention. As part of the transformation, hole pads 42 and 43 are individually shifted so as to be centered on respective holes 52 and 54, and component pads 44 are "anchored" in the predefined locations that will be aligned with the corresponding windows in a solder mask 78 (which is applied subsequently).

The loci of connecting elements 72 and 74, however, are treated as separate "populations," and are individually transformed as required in order to maintain the required connectivity between the respective hole pads and component pads. The transformations are local and may vary among different elements, including different instances of the same type of element. Typically, the transformations of these elements are constrained by design rules, which specify, for example, the minimum width and minimum distance between elements that must be maintained in the modified pattern. Referring to FIG. 4, the transformation applied to elements 72 is essentially a linear interpolation, involving angular skew and a change in length of the elements. In some cases, such as when certain angles must be maintained between connecting elements and pads, a polynomial interpolation, such as a cubic spline, may be preferable, as illustrated by elements 74 in FIG. 4. Alternatively, any other suitable local transformation may be applied to the loci of the connecting elements and will be considered to be within the scope of the present invention.

Method for Producing a Panel

Figure 5:
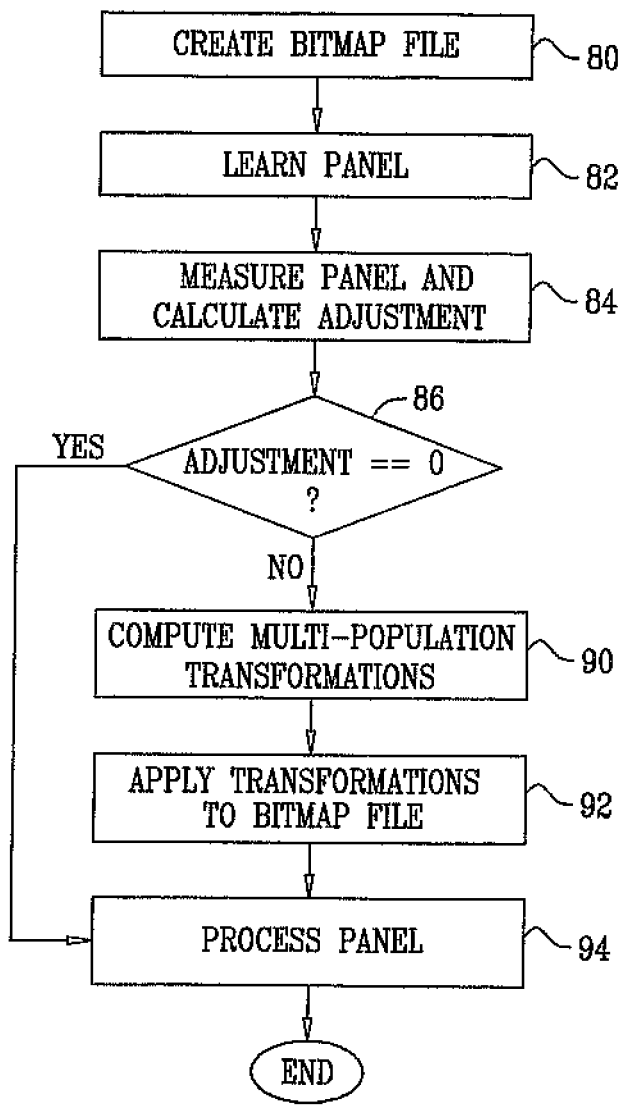
FIG. 5 is a flow chart that schematically illustrates a method for producing a printed circuit panel, in accordance with an embodiment of the present invention.

FIG. 5 is a flow chart that schematically illustrates a method for producing a printed circuit panel, in accordance with an embodiment of the present invention. The method is described, for clarity and convenience, with reference to system 20, as shown in FIG. 1, but the principles of this method may be applied in producing circuits of other kinds and by other means.

To initiate the method, processor 28 receives a file that defines the pattern that is to be written on a set of printed circuit panels by direct patterning subsystem 30, at a file processing step 80. The processor transforms this file into a map, which may be in the form of a bitmap or any other suitable type of graphical representation. This map defines the image to be written by subsystem 30 onto each panel. The file received at step 80 defines the types of elements in the pattern, including the locations and connections of the different elements in the net. As noted above, each type of element has its own predefined constraints on location and design rules that are to be applied subsequently in multi-population transformation. Processor 28 creates a suitable data structure containing the locations, spaces and other constraints on the elements in the panel design, at a panel learning step 82.

Optical sensing subsystem 26 measures the actual features on each panel, at a panel measuring step 84. In the case of the examples described above, these features comprise holes that have been drilled in each panel substrate, although other types of features may be used in a similar manner. Processor 28 compares the measured locations of these features to the locations of the corresponding elements in the bitmap pattern. In the present example, the processor determines what shifts will be required in the hole pad locations in order to align the pads with the corresponding holes.

The shifts measured at step 84 define a specific adjustment for each element of the pattern (in contrast to the type of global scale that may be applied only to an entire panel in production systems that are known in the art). For example, the processor may determine, based on the measured shift, that the desired locations of a given hole pad and component pad have drawn farther apart, because the measured dimensions of the features on the substrate differ from the default dimensions according to which the pattern was original designed. In such a case, the processor will apply an adjustment, in the form of a geometrical transformation, to the connecting element between the hole pad and the component pad. The processor checks whether any adjustment is required, at an adjustment testing step 86. If not ("ADJUSTMENT=0"), the multi-population transformation steps that follow may be skipped.

For those circuit elements for which adjustment (including translation and/or angular skew components) is required, processor 28 computes new coordinates in accordance with the rules applicable to each type of element, at a transformation computation step 90. In the present example, this step shifts the centers of hole pads to their new locations while typically holding component pads at or near their original design locations (to ensure solder mask alignment), and accordingly shifts the desired endpoints of the corresponding connecting elements. The processor applies these changes to the bitmap of the pattern, at a bitmap transformation step 92. This step may include the following operations:

Convert angular orientations of connecting elements (either by linear interpolation or more complex transformation, as shown in FIG. 4).

Check for overlap of transformed elements or distances between elements that are smaller than permitted by design rules. If such a condition is detected, narrow the elements in question. Morphological erosion, as is known in the art, may be used for this purpose.

Check for disconnection between elements that should be connected. If a disconnection is found, expand one or more of the elements by morphological dilation until the connection is restored. Erosion may then be used to reduce the elements to the desired width without breaking the connection.

The above sorts of morphological tools provide a convenient way to increase or reduce certain dimensions of elements in the pattern while maintaining connectivity and observing applicable design rules. Alternatively, other sorts of mathematical tools may be used for the same purposes.

After making the desired transformations in the bitmap, processor 28 conveys the bitmap file to direct patterning subsystem 30. Subsystem 30 then writes the modified pattern defined by the file onto the panel substrate, at a panel processing step 94.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for producing an electrical circuit, comprising:
   providing a substrate having a first pattern of features;
   defining a second pattern comprising a net of interconnected circuit elements;
   specifying a different respective transformation rule for each of a plurality of element types;
   modifying the second pattern by applying the respective transformation rule to each of the circuit elements, thereby aligning each of the circuit elements with the features in the first pattern; and
   printing the modified second pattern on the substrate.

2. The method according to claim 1,
   wherein the features in the first pattern comprise holes in the substrate, and
   wherein the circuit elements in the second pattern comprise hole pads, and
   wherein modifying the second pattern comprises shifting the hole pads into alignment with the holes.

3. The method according to claim 2,
   wherein the circuit elements in the second pattern further comprise contact pads, having respective predefined locations, and
   wherein modifying the second pattern comprises anchoring the contact pads in the respective predefined locations while shifting the hole pads relative to the contact pads.

4. The method according to claim 3,
   wherein the circuit elements in the second pattern further comprise connecting elements extending between the hole pads and the contact pads, and
   wherein modifying the second pattern comprises applying a geometrical transformation to the connecting elements, responsive to the shifting the hole pads relative to the contact pads, thereby maintaining connectivity between the hole pads and the contact pads via the connecting elements.

5. The method according to claim 3,
   wherein the respective predefined locations of the contact pads are defined by a solder mask, and
   the method further comprises applying the solder mask the substrate after printing the modified second pattern.

6. The method according to claim 1, wherein modifying the second pattern comprises applying a geometrical transformation to connecting elements in the second pattern in order to maintain connectivity of the net in the modified second pattern.

7. The method according to claim 6, wherein applying the geometrical transformation comprises adjusting a length and an angular skew of one or more of the connecting elements.

8. The method according to claim 6, wherein applying the geometrical transformation comprises applying morphological dilation and erosion in order to modify the connecting elements.

9. The method according to claim 1, wherein printing the modified second pattern comprises producing conductors on the substrate by direct writing in accordance with the modified second pattern.

10. The method according to claim 9, wherein
    modifying the second pattern comprises generating a map for use by a direct patterning subsystem; and
    printing the modified second pattern comprises the direct patterning subsystem writing the second pattern onto the substrate.

11. The method according to claim 1,
    wherein the plurality of element types comprises hole pads, contact pads, and connecting elements; and
    wherein each of the circuit elements belongs belong to one of the plurality of element types.

12. An apparatus for producing an electrical circuit, comprising:
    a processor, which is configured to:
       receive data with respect to a first pattern of features on a substrate,
       receive a second pattern comprising a net of interconnected circuit elements,
       receive a different respective transformation rule for each of a plurality of element types, and
       modify the second pattern by applying the respective transformation rule to each of the circuit elements, thereby aligning each of the circuit elements with the features in the first pattern; and
    a patterning subsystem, which is configured to print the modified second pattern on the substrate.

13. The apparatus according to claim 12,
    wherein the features in the first pattern comprise holes in the substrate, and
    wherein the circuit elements in the second pattern comprise hole pads, and
    wherein the processor is configured to modify the second pattern so as to shift the hole pads into alignment with the holes.

14. The apparatus according to claim 13,
    wherein the circuit elements in the second pattern further comprise contact pads, having respective predefined locations, and
    wherein the processor is configured to anchor the contact pads in the respective predefined locations and to shift the hole pads are relative to the contact pads.

15. The apparatus according to claim 14,
    wherein the circuit elements in the second pattern further comprise connecting elements extending between the hole pads and the contact pads, and
    wherein the processor is configured to apply a geometrical transformation to the connecting elements, responsive to a shift of the hole pads relative to the contact pads, in order to maintain connectivity between the hole pads and the contact pads.

16. The apparatus according to claim 14, wherein the respective predefined locations of the contact pads are defined by a solder mask, which is applied to the substrate after printing the modified second pattern.

17. The apparatus according to claim 12, wherein the processor is configured to apply a geometrical transformation to connecting elements in the second pattern in order to maintain connectivity of the net in the modified second pattern.

18. The apparatus according to claim 17, wherein the geometrical transformation comprises adjusting a length and an angular skew of one or more of the connecting elements.

19. The apparatus according to claim 17, wherein the processor is configured to apply morphological dilation and erosion to modify the connecting elements.

20. The apparatus according to claim 12, wherein the patterning subsystem is configured to produce conductors on the substrate by direct writing in accordance with the modified second pattern.

21. The apparatus according to claim 20, wherein the processor is configured to generate the modified pattern as a map for use by the patterning subsystem in writing the second pattern onto the substrate.

22. The apparatus according to claim 12,
wherein the plurality of element types comprises hole pads, contact pads, and connecting elements, and
wherein each of the circuit elements belongs to one of the plurality of element types.

23. A non-transitory computer-readable medium in which program instructions are stored, which instructions, when read by a computer, cause the computer to perform operations of:

receiving data with respect to a first pattern of features on a substrate, receiving a second pattern comprising a net of interconnected circuit elements, receiving a different respective transformation rule for each of a plurality of element types, modifying the second pattern by applying the respective transformation rule to each of the circuit elements, thereby aligning each of the circuit elements with the features in the first pattern, and instructing a patterning subsystem to print the modified second pattern on the substrate.

24. An electrical circuit, comprising:

a substrate;

a set of features disposed on the substrate in a first pattern; and a net of interconnected circuit elements disposed on the substrate in alignment with the features in the first pattern, wherein locations of the circuit elements are determined by modifying a second pattern, which defines the net of interconnected circuit elements, in accordance with a different respective transformation rule for each of a plurality of element types of the circuit elements, such that the circuit elements are aligned with the features.

* * * * *